(12) United States Patent
Tsujimura et al.

(10) Patent No.: US 6,391,691 B1
(45) Date of Patent: May 21, 2002

(54) METHOD OF FABRICATING A THIN FILM TRANSISTOR WITH METAL SOURCE AND DRAIN ELECTRODES BY DIFFUSING IMPURITIES FROM A SEMICONDUCTOR LAYER

(75) Inventors: Takatoshi Tsujimura, Fujisawa; Takashi Miyamoto, Chofu, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/569,941

(22) Filed: May 12, 2000

(30) Foreign Application Priority Data

May 14, 1999 (JP) .......................................... 11-133892

(51) Int. Cl.⁷ ......................... H01L 21/00; H01L 21/84
(52) U.S. Cl. ....................... 438/151; 438/161; 438/558
(58) Field of Search ................. 438/151, 161, 438/558, 564

(56) References Cited

U.S. PATENT DOCUMENTS 4,892,837 A * 1/1990 Kudo .......................... 437/31
5,700,714 A * 12/1997 Ogihara et al. ............. 437/167
5,981,317 A * 11/1999 French et al. ............... 438/161
6,251,715 B1 * 6/2001 Jung et al. .................. 438/161

FOREIGN PATENT DOCUMENTS

JP  6-22244  3/1994

* cited by examiner

*Primary Examiner*—John F. Niebling
*Assistant Examiner*—Angel Roman

(57) ABSTRACT

To provide a method of fabricating a thin film transistor which is capable of achieving a good ohmic contact between source and drain electrodes and a semiconductor layer, thereby solving problems of the conventional method.

A first semiconductor layer containing impurities is formed on substantially oxygen-free metal source and drain electrodes. The impurities contained in the first semiconductor layer are allowed to diffuse into a substrate and the source and drain electrodes. An $H_2$ plasma etching processing is performed to selectively etch the first semiconductor layer and a region of the substrate containing the impurities. A second semiconductor layer is formed on the source and drain electrodes. The impurities contained in the source and drain electrodes are allowed to diffuse into the second semiconductor layer, thus forming an ohmic contact layer.

6 Claims, 3 Drawing Sheets

METHOD OF FABRICATING A THIN FILM TRANSISTOR WITH METAL SOURCE AND DRAIN ELECTRODES BY DIFFUSING IMPURITIES FROM A SEMICONDUCTOR LAYER

FIELD OF THE INVENTION

The present invention relates to a thin film transistor used, for example, in liquid crystal displays and in large scale integrated circuits (hereinafter referred to as LSI) and a method of fabricating the same.

BACKGROUND OF THE INVENTION

In order to achieve a good ohmic contact between source and drain electrodes and a semiconductor layer made of, for example, amorphous silicon (hereinafter referred to as an a-Si layer) in fabricating a thin film transistor, there has been a method in which an $n^+$-type a-Si layer is formed on metal layers for use in the source and drain electrodes, and an ohmic contact structure is constructed between the source and drain electrodes and the a-Si layer by etching them simultaneously using a photoetching process. However, when this method is employed, an $n^+$ type layer is not formed in an etched section, and a current concentration occurs at the ends of the source and drain electrodes where the $n^+$-type layer is formed, resulting in a reduction in an effective contact area. Accordingly, there has been a problem that the ohmic contact is not brought about. That is, there has been a problem of a charge crowding effect.

A plasma doping method was developed to overcome such problem. In this method, phosphorus atoms (hereinafter referred to as P atoms) are diffused into the source and drain electrodes by generating $PH_3$ plasma on the source and drain electrodes. Thereafter, the P atoms are diffused into an a-Si film by forming the a-Si film, and an n+-type layer is formed at the interface between the source and drain electrodes and the a-Si film. However, to achieve a low contact resistivity by this method, $PH_3$ plasma doping for a long time must be performed. Implementation of the $PH_3$ plasma doping for a long time allows the P atoms to invade into a base layer ($SiO_2$ layer or glass substrate) between the source and drain regions, thus forming a leakage path. As a result, the turn ON/OFF current ratio of MOS transistors can not be set to be sufficiently large. The following Table 1 shows the contents of phosphorus in MoW alloy and glass which have been subjected to $PH_3$ plasma doping under various conditions. The contents were measured by an ESCA (electron spectroscopy for chemical analysis).

TABLE 1

|  | P/MoW | P/glass | Ratio |
| --- | --- | --- | --- |
| Condition 1 | 222.11 | 9.72 | 22.85082 |
| Condition 2 | 287.48 | 0.36 | 798.5556 |
| Condition 3 | 194.81 | 4.39 | 44.37585 |
| Condition 4 | 189.61 | 6.62 | 28.64199 |
| Condition 5 | 219.92 | 7.35 | 29.92109 |
| Condition 6 | 215.52 | 5.84 | 36.90411 |
| Condition 7 | 217.39 | 7.57 | 28.71731 |
| Condition 8 | 170.22 | 3.07 | 55.44625 |
| Condition 9 | 314.57 | 6.58 | 47.80699 |
| Condition 10 | 324.52 | 5.05 | 64.26139 |
| Condition 11 | 266.19 | 8.47 | 31.42739 |
| Condition 12 | 238.71 | 4.41 | 54.12925 |
| Condition 13 | 327.26 | 10.83 | 30.21791 |

As understood from the Table 1, the ratios of phosphorus in the MoW alloy to the phosphorus in the glass are 800:1 at maximum. Accordingly, the conventional technology using the foregoing $PH_3$ plasma doping can not avoid the problem of a leakage path.

The object of the present invention is to provide a thin film transistor which is capable of achieving a good ohmic contact between respective source and drain electrodes and a semiconductor layer and solving the problems of the ON/OFF current ratio and the leakage path, and a method of fabricating the same.

SUMMARY OF THE INVENTION

In accordance with the present invention, a method of fabricating a thin film transistor is described comprising the steps of:

forming a semiconductor oxide layer on a substrate;

forming substantially oxygen-free metal source and drain electrodes on foregoing semiconductor oxide layer;

forming a first semiconductor layer containing impurities on the foregoing semiconductor oxide layer and the foregoing source and drain electrodes, and diffusing the impurities contained in the foregoing first semiconductor layer into the foregoing semiconductor oxide layer and the foregoing source and drain electrodes;

selectively etching, by an $H_2$ plasma etching processing, the foregoing first semiconductor layer and a region of the foregoing semiconductor oxide layer containing the impurities;

forming a second semiconductor layer on the foregoing source and drain electrodes, and diffusing the impurities contained in the foregoing source and drain electrodes into the foregoing second semiconductor layer;

forming an insulating film for a gate dielectric on the foregoing second semiconductor layer;

forming a conductive layer for a gate electrode on the foregoing gate dielectric; and etching the foregoing conductive layer for the gate electrode, the foregoing gate dielectric and the foregoing second semiconductor layer into a desired pattern so as to form the gate electrode, the gate dielectric and a semiconductor layer.

The invention further provides a method for fabricating a thin film transistor comprising the steps of:

forming substantially oxygen-free metal source and drain electrodes on a substrate;

forming a first semiconductor layer containing impurities on the foregoing substrate and the foregoing source and drain electrodes, and diffusing the impurities contained in the foregoing first semiconductor layer into foregoing substrate and the foregoing source and drain electrodes;

selectively etching, by an $H_2$ plasma etching processing, the foregoing first semiconductor layer and a region of the foregoing substrate containing the impurities;

forming a second semiconductor layer on the foregoing source and drain electrodes, and diffusing the impurities contained in the foregoing source and drain electrodes into the foregoing second semiconductor layer;

forming an insulating film for a gate dielectric on the foregoing second semiconductor layer;

forming a conductive layer for a gate electrode on the foregoing insulating film; and etching the foregoing conductive layer for the gate electrode, the foregoing insulating film and the foregoing second semiconductor layer to a desired pattern, thereby the gate electrode, the gate dielectric and a semiconductor layer being formed.

The first semiconductor layer containing impurities, for example, phosphorus, formed on the semiconductor oxide layer and the source and drain electrodes and phosphorus-diffused portions of the foregoing semiconductor oxide layer and the foregoing substrate are selectively etched by the $H_2$ plasma etching processing. However, phosphorus-diffused portions of the foregoing substantially oxygen-free metal source and drain electrodes are not etched. Accordingly, the phosphorus is diffused from the foregoing source and drain electrodes into the second semiconductor layer formed thereon, thus forming an ohmic contact. On the other hand, since portions into which the phosphorus is diffused do not remain on the semiconductor oxide layer and the substrate between the source and drain electrodes, the problem of the leakage path in the above described conventional plasma doping method does not occur.

Materials for the source and drain electrodes should not be etched by the $H_2$ plasma etching under the condition that the phosphorus is diffused thereinto. Accordingly, it is preferable that the material for the source and drain electrodes is a substantially oxygen-free metal, particularly a MoW alloy.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
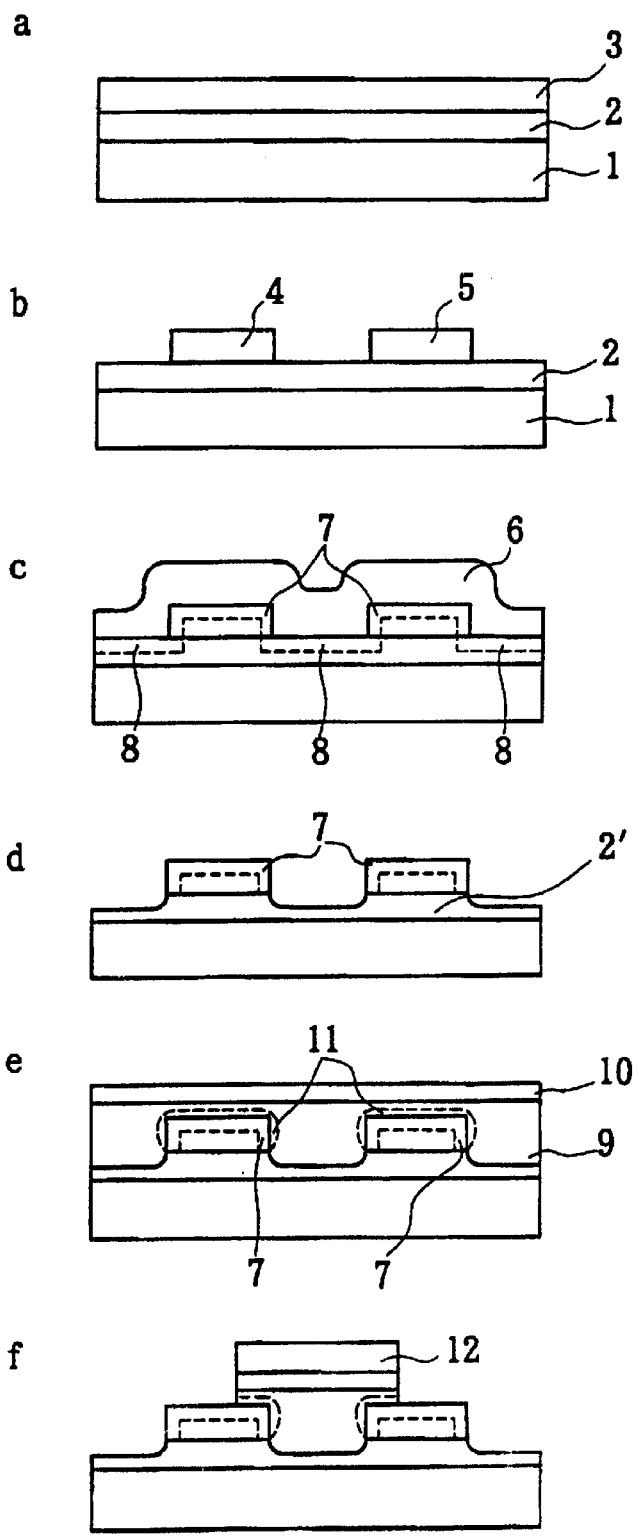
FIGS. 1A to 1F are cross sectional views showing the steps of a method for fabricating a thin film transistor of the present invention.

Referring now to the drawing, FIGS. 1A to 1F, are cross sectional views showing steps of a method for fabricating a thin film transistor of the present invention. First, an $SiO_2$ film 2 is formed on a substrate 1 which may be transparent, for example, glass, and an MoW alloy film 3 is formed on the $SiO_2$ film 2, for example, by a sputtering method, as shown in FIG. 1A. Next, the MoW alloy film 3 is etched, for example, by a dry etching so as to form a source electrode 4 and a drain electrode 5 as shown in FIG. 1B. Subsequently, as shown in FIG. 1C, an n+-type amorphous silicon (n+-type a-Si) film 6 containing phosphorus P as impurities is formed on the resultant structure of FIG. 1B, for example by a CVD (Chemical Vapor Deposition) method. By the formation of the n+-type a-Si film 6, phosphorus diffuses from the a-Si film 6 to the source and drain electrodes made of MoW and into $SiO_2$ film 2, thus forming a phosphorus-containing MoW layer 7 and a phosphorus-containing $SiO_2$ layer 8. Thereafter, etching is performed in an $H_2$ plasma etching step. The n+-type a-Si film 6 is etched away and the phosphorus-containing $SiO_2$ layer 8 is subjected to a reduction by $H_2$, so that the phosphorus-containing $SiO_2$ layer 8 is concurrently etched. On the other hand, the phosphorus-containing MoW layer 7 is hardly etched. Accordingly, as shown in FIG. 1D, the phosphorus-containing $SiO_2$ layer 8 is removed, leaving $SiO_2$ layer 2' containing no phosphorus and the phosphorus-containing MoW layer 7.

Next, as shown in FIG. 1E, another a-Si film 9 and a gate dielectric 10 made, for example, of silicon nitride are formed on the resultant structure of FIG. 1D. At this time, phosphorus atoms are diffused from the phosphorus-containing MoW layer 7 into the a-Si film 9, forming a phosphorus-containing a-Si layer, that is, an ohmic contact layer 11. Thereafter, a gate electrode 12 is formed, for example, by sputtering and patterned. The a-Si film 9 and the gate dielectric 10 are dry-etched. Thus, a top gate type thin film transistor (TFT) as shown in FIG. 1F is fabricated. In the present invention, the impurity (phosphorus) concentration should be $10^{17}$ atoms/cm$^3$ or more in the surfaces of the source and drain electrodes and $10^{16}$ atoms/cm$^3$ or less in the surface of the region between the source and drain electrodes.

Figure 2:
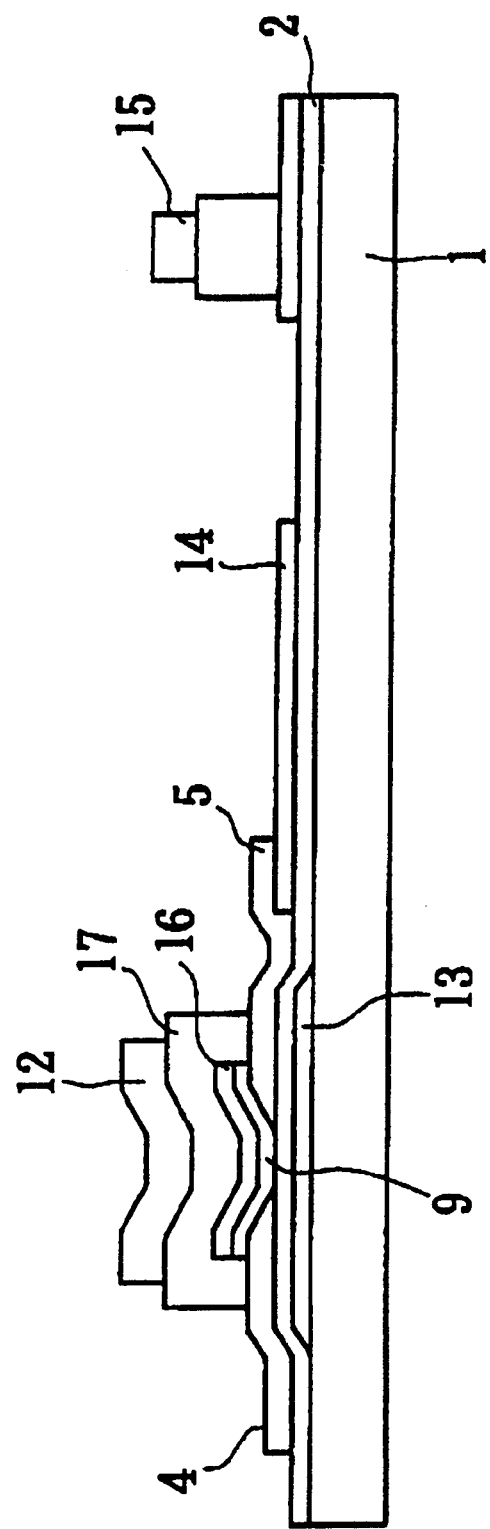
FIG. 2 is a cross sectional view showing an example of a top gate type TFT fabricated according to the method of fabricating a thin film transistor of the present invention.

FIG. 2 is a sectional view showing an example of the top gate type TFT 18 for use in a liquid crystal display device 20 fabricated in the above described manner. Constituent components exhibiting functions essentially identical to those in FIG. 1 will be denoted using the same reference numerals. The TFT 18 shown in FIG. 2 further comprises a light shielding layer 13 made of, for example, Mo, an ITO electrode 14 and a data line 15. A first silicon nitride layer 16 and a second silicon nitride layer 17 correspond to the gate dielectric 10 of FIG. 1.

Figure 3:
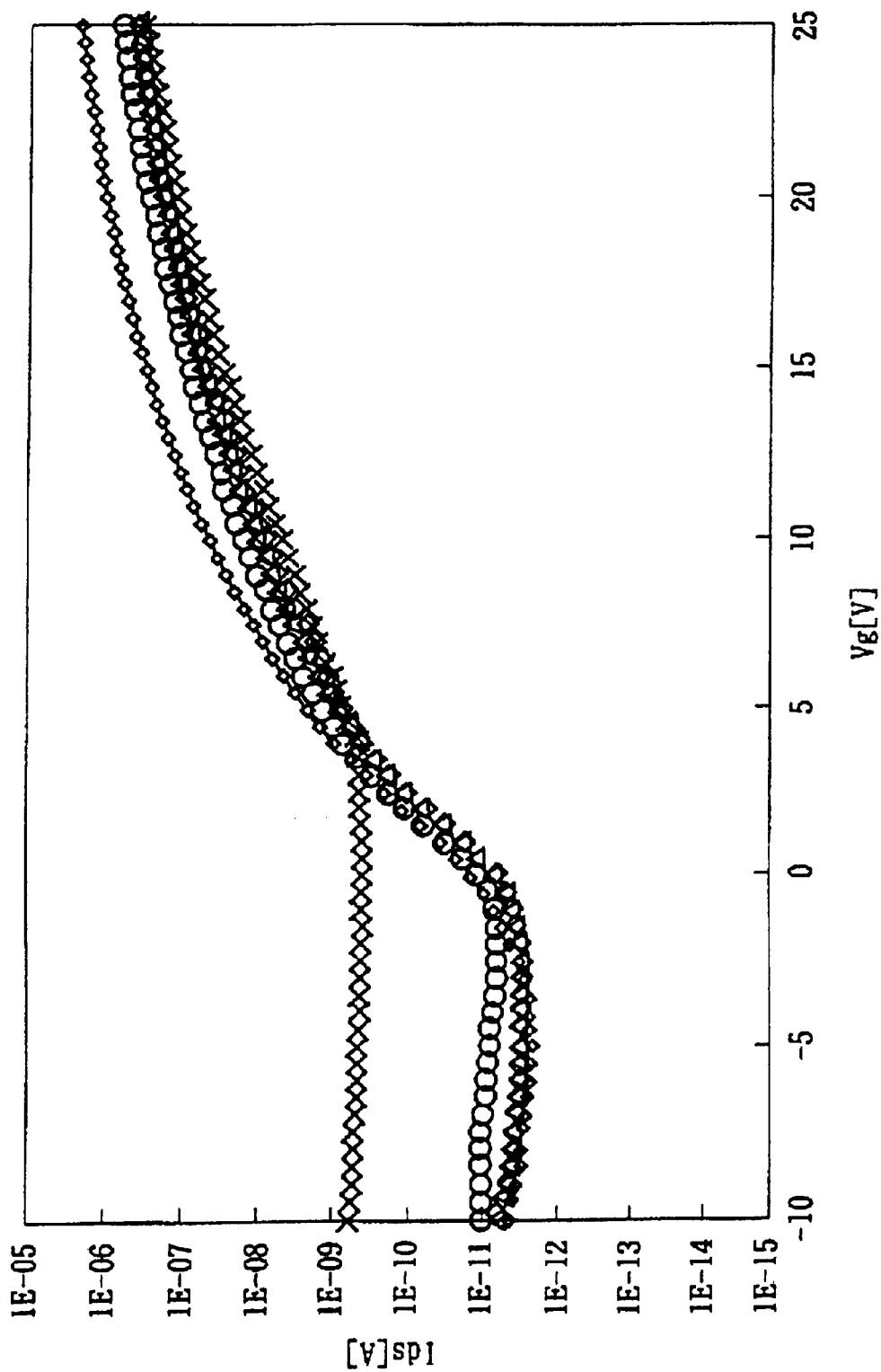
FIG. 3 is a graph of curves showing a relationship between a drain current and a gate voltage of two TFTs: one is a TFT fabricated by the method of fabricating a thin film transistor of the present invention and the other is a TFT fabricated by a conventional method.

According to the present invention, a method of fabricating a thin film transistor 18 is provided which is capable of achieving a good ohmic contact between source and drain electrodes 4' and 5' and a semiconductor layer 9', thereby solving problems of the conventional method. FIG. 3 is a graph showing curves of relationships between a drain current $I_d$ and a gate voltage $V_g$ of two TFTs: one is a TFT 18 fabricated by the method of fabricating a thin film transistor of the present invention shown in FIGS. 1 and 2 and the other is a TFT fabricated in the manner that a phosphorus-containing $SiO_2$ layer 8 of the former TFT is not removed in an $H_2$ plasma etching step. Curve 30 shows a large OFF current is exhibited by the TFT in which the phosphorus-containing $SiO_2$ layer is not removed. As is understood from this graph, according to the method of fabricating a thin film transistor 18 of the present invention, since no problem of the leakage path of the conventional method, a TFT exhibiting a large current ON/OFF ratio as shown by curves 32, 34 and 36 can be fabricated.

Furthermore, according to the method of fabricating a thin film transistor 18 of the present invention, since the thin film transistor 18 can be fabricated by a very small number of steps, it is possible to significantly reduce costs of the TFT 18/LCD 20. Moreover, a gate line with a very low resistivity can be realized, so that a large scale and highly microfabricated TFT 18/LCD 20 can be realized.

While there has been described and illustrated a thin film transistor and a method for fabricating, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. A method of fabricating a thin film transistor comprising the steps of:

forming a semiconductor oxide layer on a substrate;

forming substantially oxygen-free metal source and drain electrodes on said semiconductor oxide layer;

forming a first semiconductor layer containing impurities on said semiconductor oxide layer and said source and drain electrodes, and diffusing a first portion of said impurities contained in said first semiconductor layer into said semiconductor oxide layer and said source and drain electrodes;

selectively etching said first semiconductor layer and a region of said semiconductor oxide layer containing some of said impurities;

forming a second semiconductor layer on said source and drain electrodes and said semiconductor oxide layer, and diffusing a second portion of said impurities contained in said source and drain electrodes into said second semiconductor layer;

forming an insulating film for a gate dielectric on said second semiconductor layer;

forming a conductive layer for a gate electrode on said gate dielectric; and etching said conductive layer to form said gate electrode, said gate dielectric and said second semiconductor layer into a desired pattern, thereby the gate electrode, the gate dielectric and a semiconductor layer being formed.

2. The method according to claim 1 wherein said substantially oxygen-free metal is a MoW alloy.

3. The method according to claim 1 wherein said step of selectively etching includes the step of etching by an $H_2$ plasma etching process.

4. A method for fabricating a thin film transistor, comprising the steps of:

forming substantially oxygen-free metal source and drain electrodes on a substrate;

forming a first semiconductor layer containing impurities on said substrate and said source and drain electrodes, and diffusing the impurities contained in said first semiconductor layer into said substrate and said source and drain electrodes;

selectively etching said first semiconductor layer and a region of said substrate containing the impurities;

forming a second semiconductor layer on said source and drain electrodes, and diffusing the impurities contained in said source and drain electrodes into said second semiconductor layer;

forming an insulating film for a gate dielectric on said second semiconductor layer;

forming a conductive layer for a gate electrode on said insulating film; and etching said conductive layer for the gate electrode, said insulating film and said second semiconductor layer into a desired pattern, thereby the gate electrode, the gate dielectric and a semiconductor layer being formed.

5. The method according to claim 4 wherein said substantially oxygen-free metal is a MoW alloy.

6. The method according to claim 4 wherein said step of selectively etching includes the step of etching by an $H_2$ plasma etching process.

* * * * *